(12) United States Patent
Harada

(10) Patent No.: US 7,341,896 B2
(45) Date of Patent: Mar. 11, 2008

(54) METHOD OF MANUFACTURING A VERTICAL MOS TRANSISTOR

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/513,005

(22) Filed: Aug. 30, 2006

(65) Prior Publication Data

US 2006/0292764 A1 Dec. 28, 2006

Related U.S. Application Data

(62) Division of application No. 10/812,443, filed on Mar. 30, 2004, now abandoned.

(30) Foreign Application Priority Data

Apr. 3, 2003 (JP) .............................. 2003-099926

(51) Int. Cl.
*H01L 21/00* (2006.01)

(52) U.S. Cl. ..................... 438/156; 438/206; 438/212; 438/268

(58) Field of Classification Search ................ 438/156, 438/192, 206, 209, 212, 268
See application file for complete search history.

(56) References Cited

U.S. PATENT DOCUMENTS

2003/0089946 A1* 5/2003 Hshieh et al. .............. 257/338

* cited by examiner

*Primary Examiner*—Fernando L. Toledo
(74) *Attorney, Agent, or Firm*—Adams & Wilks

(57) ABSTRACT

In a method of manufacturing a vertical MOS transistor, a body region, a trench, a gate oxide film, a gate electrode, a source region, and a body contact region are successively formed in a semiconductor substrate. A first insulating film is deposited over the main surface of the semiconductor substrate and the gate electrode, and the first insulating film is then etched to form side spacers made of the first insulating film on the wall surfaces of the trench so as to overly the gate electrode. A second insulating film is deposited over a main surface of the semiconductor substrate, the gate electrode, and the first insulating film. The second insulating film is then etched back so as to entirely expose the source region and the body contact region. A source metal electrode is formed over the main surface of the semiconductor substrate so as to cover the source region and body contact region.

8 Claims, 5 Drawing Sheets

METHOD OF MANUFACTURING A VERTICAL MOS TRANSISTOR

CROSS REFERENCE TO RELATED APPLICATIONS

The present application is a division of prior parent U.S. application Ser. No. 10/812,443, filed Mar. 30, 2004, now abandoned, which is hereby incorporated by reference, and priority thereto for common subject matter is hereby claimed.

BACKGROUND OF THE INVENTION

1. Field of the Invention

The present invention relates to a vertical MOS transistor having a trench structure and a method of manufacturing the same.

2. Description of the Related Art

FIG. 2 illustrates a schematic sectional view of a conventional vertical MOS transistor having a trench structure. A semiconductor substrate is formed in which a first conductive type lightly doped layer 2 is epitaxially grown on a first conductive type heavily doped substrate 1 to be a drain region. Then, a second conductive type diffusion region 3 referred to as a body region is formed from a surface of the semiconductor substrate by impurity implantation and high temperature thermal treatment at 1000° C. or higher. Further, from the surface, a first conductive type heavily doped impurity region 7 to be a source region and a second conductive type heavily doped body contact region 8 for the purpose of fixing a potential of the body region by an ohmic contact are formed. Here, since a potential of the first conductive type source region 7 and a potential of the second conductive type body contact region 8 are usually the same, the regions are laid out so as to be in contact with each other at surfaces as shown in FIG. 2. Then, intermediate insulating films 9 are formed on the surfaces. A source electrode 15 formed in the contact hole 13 on the source region 7 and the body contact region 8 electrically connects the source region 7 and the body contact region 8 to each other. A silicon trench 4 is formed by etching a single crystalline silicon, to be an epitaxially grown layer, through the first conductive type source region 7. A gate insulating film 5 and a polycrystalline silicon 6 containing a high concentration of impurity serving as a gate electrode fill the silicon trench 4. Further, the first conductive type heavily doped substrate 1 on a rear side of the semiconductor substrate is connected to a drain metallic electrode 16. As the intermediate insulating film 9 is formed on the surface of the silicon gate electrode 6, the silicon gate electrode 6 and the source region 7 do not short.

The above structure can function as a vertical MOS transistor in which a current from a drain formed of the first conductive type heavily doped substrate 1 on the rear side and the first conductive type epitaxial region 2 to a source formed of the first conductive type heavily doped region 7 on a front side is controlled through the gate insulating film 5 on a side wall of the trench 4 by the gate electrode 6 buried in the trench 4. This method can accommodate both an N-channel MOS transistor and a P-channel MOS transistor by appropriately reversing the conductive types between an N type and a P type.

Further, the vertical MOS transistor having the trench structure is characteristic in that, since a channel is formed completely vertically, the transistor allows application of technologies for miniaturization in a flat surface direction.

As a result of development in miniaturization technologies, the area occupied by a flat transistor has become smaller and in recent years, there is a tendency that the amount of a drain current flowing onto the element unit area has increased.

In reality, when forming a plurality of cross section constructions by folding, as shown in FIG. 2, there is achieved a MOS transistor having an optional driving capacity, increased channel width, and increased amount of drain current. A basic structure of such a vertical MOS transistor and a method of manufacturing the same are schematically disclosed in, for example, U.S. Pat. No. 4,767,722.

However, such a structure of a vertical MOS transistor and a method of manufacturing the same have the following problems.

First of all, since the contact hole 13 is formed so as to extend over the heavily doped source region 7 and the body contact region 8 when the contact hole 13 is formed, it is necessary to provide a large area of the contact hole 13 in consideration of a layout margin for deviation in alignment between both of the regions 7 and 8. In addition, in order to avoid electrical conduction between the gate electrode 6 and the source electrode 15, a space defined between the contact hole 13 and a pattern of the trench 4 needs to be set at intervals in consideration of the layout margin for deviation in alignment. Then, these settings become a cause for impeding scale down (shrink) of the vertical MOS transistor, and obstructs miniaturization, low cost promotion or enhancement of a driving ability.

Secondarily, as described above, in recent years, the vertical MOS transistor has a tendency to increase density of a flowing drain current due to scale down, and along with this tendency, a thickness of a deposited film made of metal has been increased from a viewpoint of enhancement of reliability and low resistance promotion.

In general, the source metal electrode 15 formed within the contact hole 13 so as to be located above the heavily doped source region 7 is formed by utilizing the sputtering method. However, since the metal coating property in an edge portion 17 of the contact hole 13 as shown in FIG. 2 is poor due to the anisotropy of the deposition, a thickness of the edge portion of the contact hole 13 becomes about half that of a flat portion, and becomes equal to or smaller than ⅓ of that of the flat portion when the worst comes to the worst in some cases. For this reason, in order to avoid concentration of a current on this edge portion, and disconnection and insufficient reliability due to the current concentration, it is necessary to form a thicker metal film. However, this causes not only a change for the worse of throughput and pattern processing accuracy, but also an increase in material cost.

SUMMARY OF THE INVENTION

To solve the above-mentioned problems, the present invention provides a method of manufacturing a vertical MOS transistor, including: carrying out anisotropic etching for a region in which a trench is intended to be formed on a main surface of a semiconductor substrate of a first conductivity type to form the trench; forming a gate oxide film over the main surface of the semiconductor substrate of the first conductivity type and along wall surfaces of the trench; depositing a polycrystalline silicon layer so as to overlie the gate oxide film; etching the polycrystalline silicon layer so as to remove the polycrystalline silicon layer overlying the main surface of the semiconductor substrate and so as to remove the polycrystalline layer within the trench to a predetermined depth from the main surface of the semiconductor substrate to form a gate electrode within the trench; implanting an impurity of a second conductivity type into the main surface of the semiconductor substrate of the first conductivity type and thermally diffusing the impurity of the second conductivity type to form a body region of the second conductivity type; implanting an impurity of the first conductivity type into the main surface of the semiconductor substrate to form a source region of the first conductivity type; implanting an impurity of the second conductivity type into the main surface of the semiconductor substrate to form a body contact region of the second conductivity type; depositing an intermediate insulating film over the main surface of the semiconductor substrate and the gate electrode; etching back the intermediate insulating film overlying the main surface of the semiconductor substrate so as to entirely expose the source region and the body contact region constituting the main surface of the semiconductor substrate; and forming a source metal electrode over the main surface of the semiconductor substrate.

Further, there is provided a method of manufacturing a vertical MOS transistor, including: carrying out anisotropic etching for a region in which a trench is intended to be formed on a main surface of a semiconductor substrate of a first conductivity type to form the trench; forming a gate oxide film over the main surface of the semiconductor substrate of the first conductivity type and along wall surfaces of the trench; depositing a polycrystalline silicon layer so as to overlie the gate oxide film; etching the polycrystalline silicon layer so as to remove the polycrystalline silicon layer overlying the main surface of the semiconductor substrate and so as to remove the polycrystalline layer within the trench to a predetermined depth from the main surface of the semiconductor substrate to form a gate electrode within the trench; implanting an impurity of a second conductivity type into the main surface of the semiconductor substrate of the first conductivity type and thermally diffusing the impurity of the second conductivity type to form a body region of the second conductivity type; implanting an impurity of the first conductivity type into the main surface of the semiconductor substrate to form a source region of the first conductivity type; implanting an impurity of the second conductivity type into the main surface of the semiconductor substrate to form a body contact region of the second conductivity type; depositing a first insulating film over the main surface of the semiconductor substrate; removing the first insulating film overlying the main surface of the semiconductor substrate by utilizing the anisotropic etching to form side spacers made of the first insulating film on the wall surfaces of the trench overlying the gate electrode; depositing an intermediate insulating film over the main surface of the semiconductor substrate and the gate electrode; etching back the intermediate insulating film overlying the main surface of the semiconductor substrate so as to entirely expose the source region and the body contact region constituting the main surface of the semiconductor substrate; and forming a source metal electrode over the main surface of the semiconductor substrate.

Furthermore, there is provided a method of manufacturing a vertical MOS transistor, including: carrying out anisotropic etching for a region in which a trench is intended to be formed on a main surface of a semiconductor substrate of a first conductivity type to form the trench; forming a gate oxide film over the main surface of the semiconductor substrate of the first conductivity type and along wall surfaces of the trench; depositing a polycrystalline silicon layer so as to overlie the gate oxide film; etching the polycrystalline silicon layer so as to remove the polycrystalline silicon layer overlying the main surface of the semiconductor substrate and so as to remove the polycrystalline layer within the trench to a predetermined depth from the main surface of the semiconductor substrate to form a gate electrode within the trench; implanting an impurity of a second conductivity type into the main surface of the semiconductor substrate of the first conductivity type and thermally diffusing the impurity of the second conductivity type to form a body region of the second conductivity type; implanting an impurity of the first conductivity type into the main surface of the semiconductor substrate to form a source region of the first conductivity type; implanting an impurity of the second conductivity type into the main surface of the semiconductor substrate to form a body contact region of the second conductivity type; depositing a first insulating film in a thickness in which the trench is perfectly filled with the first insulating film and the surface of the first insulating film reaches the main surface of the semiconductor substrate to perfectly flatten a surface of the first insulating film overlying the main surface of the semiconductor substrate; etching back the first insulating film so as to remove the first insulating film overlying the main surface of the semiconductor substrate and so as to leave the first insulating film within the trench; depositing an intermediate insulating film over the main surface of the semiconductor substrate and the gate electrode; etching back the intermediate insulating film overlying the main surface of the semiconductor substrate so as to entirely expose the source region and the body contact region constituting the main surface of the semiconductor substrate; and forming a source metal electrode over the main surface of the semiconductor substrate.

In the method of manufacturing a vertical MOS transistor, the first insulating film may be formed of a silicon nitride film. Moreover, in the method of manufacturing a vertical MOS transistor, the thickness of the first insulating film may fall within a range of 0.3 to 1.0 μm.

DETAILED DESCRIPTION OF THE PREFERRED EMBODIMENTS

Preferred embodiments of the present invention will hereinafter be described in detail with reference to the accompanying drawings.

Figure 1:
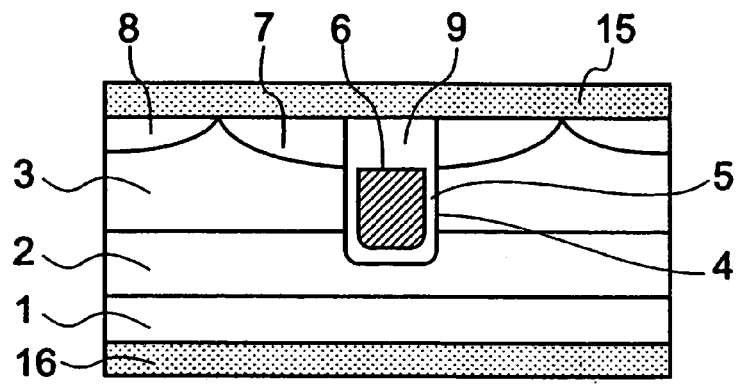
FIG. 1 is a schematic cross sectional view of a vertical MOS transistor according to the present invention.
Figure 2:
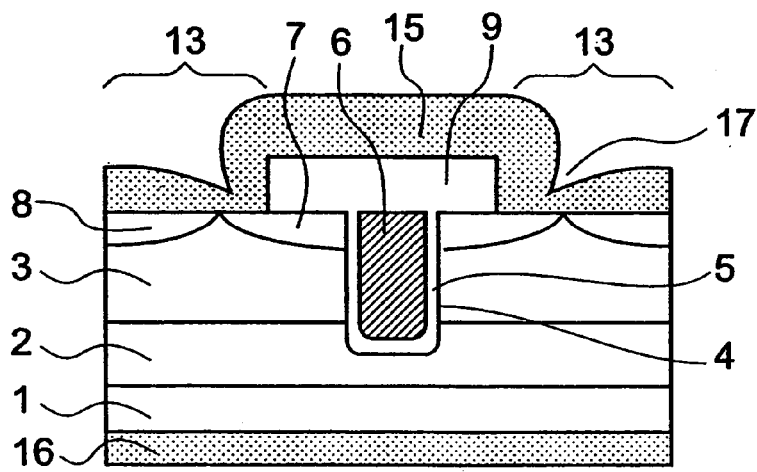
FIG. 2 is a schematic cross sectional view of a conventional vertical MOS transistor.

FIG. 1 is a schematic cross sectional view of an N-channel vertical MOS transistor according to the present invention. A lightly doped layer 2 of a first conductivity type is epitaxially grown over a heavily doped substrate 1 of the first conductivity type having a region intended to become a drain region, forming a semiconductor substrate of the first conductivity type. An impurity is implanted into a main surface of the semiconductor substrate and the semiconductor substrate is then subjected to a heat treatment at a temperature equal to or higher than 1,000° C. to form a diffusion region 3 of a second conductivity type intended to be a body region. Moreover, a heavily doped region 7 of the first conductivity type intended to become a source region, and a heavily doped body contact region 8 for fixing an electric potential of the body region through ohmic contact are formed so as to underlie the main surface of the semiconductor substrate.

A trench 4 is formed in a central portion of the surface of the source region 7, and a polycrystalline silicon gate electrode 6 is provided within the trench 4 through a gate insulating film 5. An upper surface of the polycrystalline silicon gate electrode 6 is made to coincide or agree with in level with an interface between the source region 7 and the body region 3. An intermediate insulating film is formed within a remaining portion of the trench above that level. Then, a source electrode 15 made of a metal film is formed on the main surface of the semiconductor substrate. The source region 7 and the body contact region 8 are electrically connected to each other through the source electrode 15. Here, as the contact for the electrical connection, the silicon surface other than the silicon trench is uniformly exposed, and the metallic film 15 is made to flatly contact the semiconductor substrate.

At this time, in order to prevent the metal film 15 from contacting the gate electrode 6 made of heavily doped polycrystalline silicon and provided within the trench, the heavily doped polycrystalline silicon 6 is buried down to the middle of the trench 4, and an intermediate insulating film 9 is formed so as to overlie the heavily doped polycrystalline silicon 6. In addition, it is similar to the conventional vertical MOS transistor that a heavily doped region of the first conductivity type on a rear face of the heavily doped semiconductor substrate 1 is connected to a drain metal electrode 16.

A depth of the gate electrode 6 made of the heavily doped polycrystalline silicon and provided within the trench 4 is desirably equal to or larger than 0.5 µm. This value is adopted in order to prevent the high frequency characteristics from being impeded by a capacity defined between the gate electrode 6 and a corresponding portion of the source electrode 15 right above the gate electrode 6. In addition, the depth of the gate electrode 6 made of the heavily doped polycrystalline silicon, taking the diffusion depth of the heavily doped source region into consideration, is desirably equal to or smaller than 1.0 µm. This value is adopted since if there is carried out the heat treatment for deeply diffusing the source region 7 to a depth equal to or larger than 1.0 µm, then a depth of the body region 3 is also influenced to fluctuate. That is to say, the depth of the gate electrode made of the heavily doped polycrystalline silicon is preferably set to a range of 0.5 to 1.0 µm.

With the structure as described above, similarly to the related art example, the vertical MOS transistor according to the present invention can be made to function as a vertical MOS transistor in which a current caused to flow from the drain region constituted by the heavily doped semiconductor substrate 1 of the first conductivity type on a rear face side and the epitaxial region 2 of the first conductivity type to the source region constituted by the heavily doped region 7 of the first conductivity type on a surface side is controlled with the gate electrode 6 made of the polycrystalline silicon and buried within the trench 4 through the gate insulating film 5 on side walls of the trench 4.

Moreover, there is no need to provide a layout margin for deviation in alignment between the contact hole, and the heavily doped source region 7 and the heavily doped body contact region 8, and the space provided in consideration of deviation of the space defined between the contact hole and the trench 4 which become problems in the related art example. Consequently, the vertical MOS transistor can be formed with an area smaller than that in the conventional one, and hence not only miniaturization, but also large current promotion can be realized.

In addition, as shown in FIG. 1, the metal film 15 is perfectly flat, and hence there is no roughness in a necessary portion during the film deposition as in the related art example. Hence, the metal film having a uniform thickness can be formed by utilizing the conventional sputtering method, and a current is prevented from being partially concentrated on a thinner portion such as the edge portion of the contact hole. As a result, it is possible to form the highly reliable source electrode having a thickness smaller than that of the conventional one.

In addition, an N type or a P type is appropriately selected as a conductivity type to allow this method to be accommodated to both an N-channel MOS transistor and a P-channel MOS transistor.

A method including manufacturing the vertical MOS transistor for implementing the present invention will hereinafter be described with reference to FIGS. 3 to 12 by giving an N-channel MOS transistor as an example.

Figure 3:
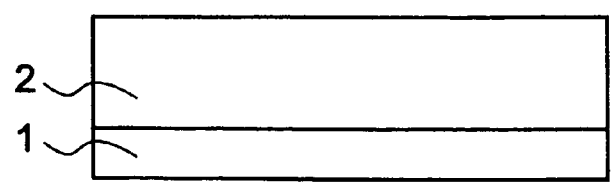
FIG. 3 is a schematic cross sectional view showing a process in a method including manufacturing a vertical MOS transistor according to the present invention.
Figure 4:
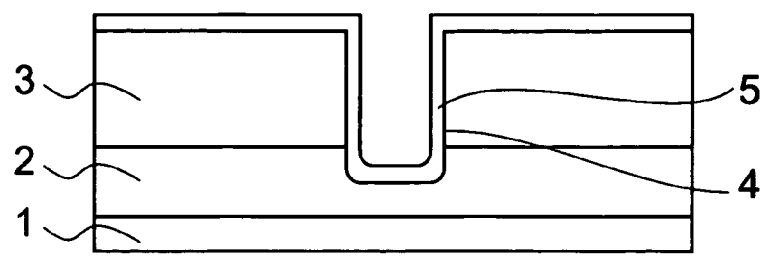
FIG. 4 is a schematic cross sectional view showing a process I in the method including manufacturing a vertical MOS transistor according to the present invention.

First of all, there is prepared the semiconductor substrate having <100>surface orientation in which the lightly doped N-type epitaxial layer 2 with a thickness of several µm to several tens of µm which was doped with P with a doping concentration of $2e^{14}/cm^3$ to $4e^{16}/cm^3$ is formed on the heavily doped N-type semiconductor substrate 1 which was doped with As or Sb so that its resistivity falls within a range of 0.001 to 0.01 Ω·cm (refer to FIG. 3). The thickness and the impurity concentration of the N type epitaxial layer 2 are arbitrarily selected depending on a required drain to source withstand voltage and a required ability to drive a current.

Next, B is implanted into the main surface of the semiconductor substrate in order to form a region 3 intended to become the body region of this vertical MOS transistor. The semiconductor substrate is then subjected to the heat treatment to thereby form the P-type body region 3 which has an impurity concentration of $2e^{16}/cm^3$ to $2e^{17}/cm^3$ and has a depth of several μm to several tens of μm. Next, a portion of monocrystalline silicon corresponding to a region in which the trench is intended to be formed is exposed with an oxide film or a photo resist film as a mask, and silicon of the epitaxial layer 2 is selectively etched away across the body region 3 by utilizing the anisotropic etching method such as the RIE to form the trench 4.

Next, edge portions of the trench are rounded by utilizing the well-known method such as the high temperature sacrificial oxidation or the anisotropic dry etching. Thereafter, the gate insulating film 5 is formed on side walls and a bottom surface of the trench 4 (refer to FIG. 4).

Figure 5:
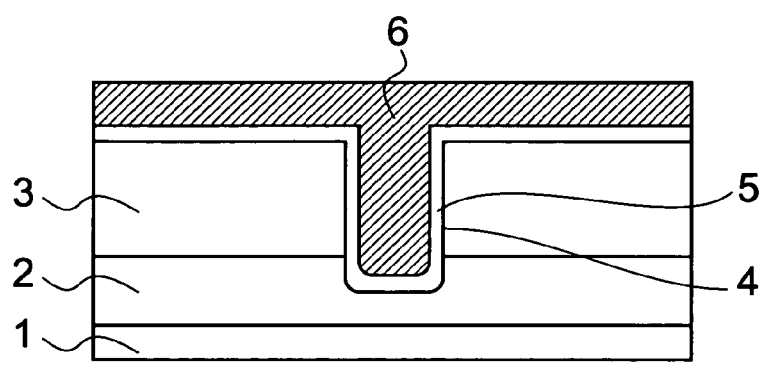
FIG. 5 is a schematic cross sectional view showing a process II in the method including manufacturing a vertical MOS transistor according to the present invention.
Figure 6:
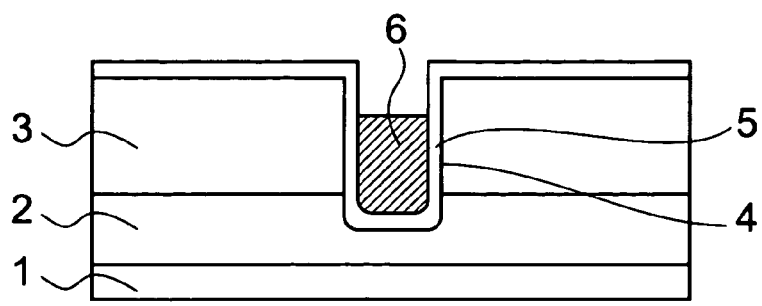
FIG. 6 is a schematic cross sectional view showing a process III in the method including manufacturing a vertical MOS transistor according to the present invention.

Thereafter, first of all, the polycrystalline silicon 6 containing therein an impurity in high concentration is deposited in a thickness depending on a width of the trench 4 so as to be perfectly filled in the trench 4 to flatten the main surface (refer to FIG. 5). When the trench width is 0.8 μm for example, the polycrystalline silicon with a thickness of equal to or larger than 0.4 μm is deposited. As for a method including forming the polycrystalline silicon 6 containing therein an impurity in high concentration, there may be used an arbitrary method such as a method in which after polycrystalline silicon containing therein no impurity is firstly deposited, an impurity is diffused into the polycrystalline silicon by utilizing the thermal diffusion or ion implantation method, or a method including introducing an impurity while polycrystalline silicon is deposited.

Next, the polycrystalline silicon 6 formed over the main surface of the semiconductor substrate and inside the trench 4 is etched by utilizing the etch back method until at least the polycrystalline silicon 6 covering the main surface of the semiconductor substrate is perfectly removed. At this time, the polycrystalline silicon filled in the trench is intentionally etched to a depth of 0.5 to 1.0 μm from the surface (refer to FIG. 6). The depth of the surface of the polycrystalline silicon 6 within the trench 4 is adjusted on the basis of the etching time which is detected in the form of a change in quantity of radicals or the like when the main surface of the semiconductor substrate is exposed during the etching of the polycrystalline silicon 6.

Figure 7:
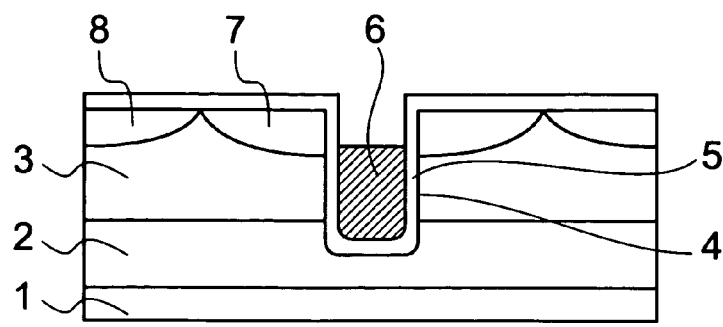
FIG. 7 is a schematic cross sectional view showing a process IV in the method including manufacturing a vertical MOS transistor according to the present invention.
Figure 8:
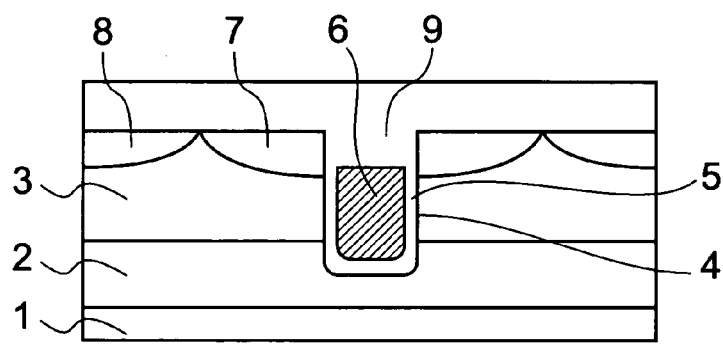
FIG. 8 is a schematic cross sectional view showing a process V in the method including manufacturing a vertical MOS transistor according to the present invention.

Next, similarly to the ordinary MOS manufacturing process, the implantation of As for formation of the heavily doped source region 7, the implantation of B or $BF_2$ for formation of the heavily doped body contact region 8, and the processing for activating As and B or $BF_2$ are carried out (refer to FIG. 7). At this time, the diffusion is continuously carried out until the lower surface of the heavily doped source region 7 reaches a level of the surface of the polycrystalline silicon 6 filled in the silicon trench.

Next, the intermediate insulating film 9 is deposited so as to flatten the irregularities due to the formation of the silicon trench to the middle of which the heavily doped polycrystalline silicon is filled. This flattening method, for example, is such that an oxide film having a low softening point such as a BSG (Boron Silicate Glass) film, a PSG (Phosphor Silicate Glass) film or a BPSG (Boron-Phosphor Silicate Glass) film is formed with a material such as TEOS (Tetraethlothorsilicate) or NSG (Non-Silicate Glass) as a base by utilizing the CVD method, and the annealing is then carried out to flatten the surface (refer to FIG. 8).

Figure 9:
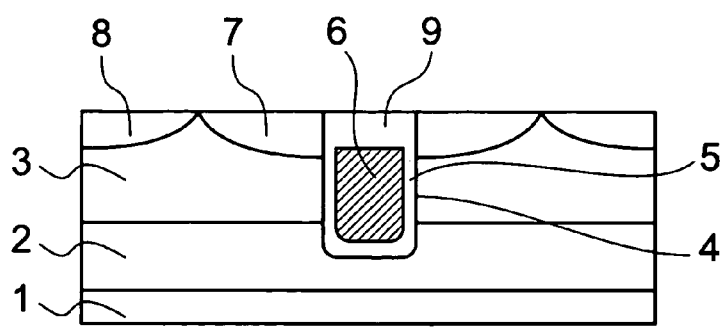
FIG. 9 is a schematic cross sectional view showing a process VI in the method including manufacturing a vertical MOS transistor according to the present invention.

Thereafter, the intermediate insulating film is etched by utilizing the etch back method to expose the heavily doped source region 7 and the heavily doped body contact region 8 with a part of the intermediate insulating film 9 being left within the trench (refer to FIG. 9).

Figure 10:
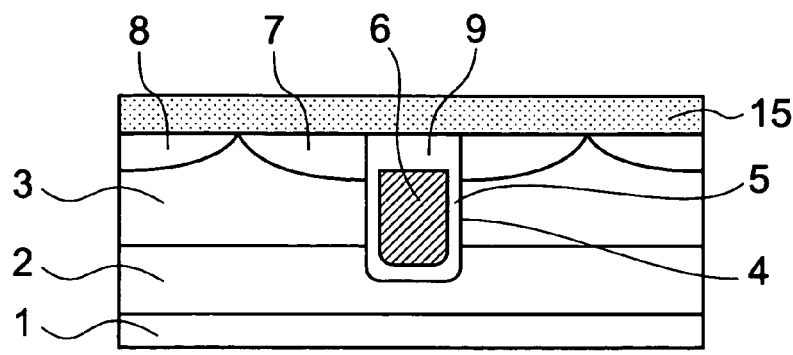
FIG. 10 is a schematic cross sectional view showing a process VII in the method including manufacturing a vertical MOS transistor according to the present invention.

Next, the metal layer 15 for providing electric potentials for the source region 7 and the body region 3 is formed (refer to FIG. 10). In case of the related art example, there is adopted a method in which the contact hole is formed across the intermediate insulating film 9 so that the metal film selectively contacts only the heavily doped source region 7 and the heavily doped body region 8. In the present invention, however, since the heavily doped polycrystalline silicon 6 within the trench is covered with the intermediate insulating film 9, the metal contact can be attained with the metal film being formed over the transistor region. In addition, since the substrate surface is previously planarized or flattened by utilizing the etch back method, the formed metal film also has high flatness (i.e., has a highly planar structure.

Figure 11:
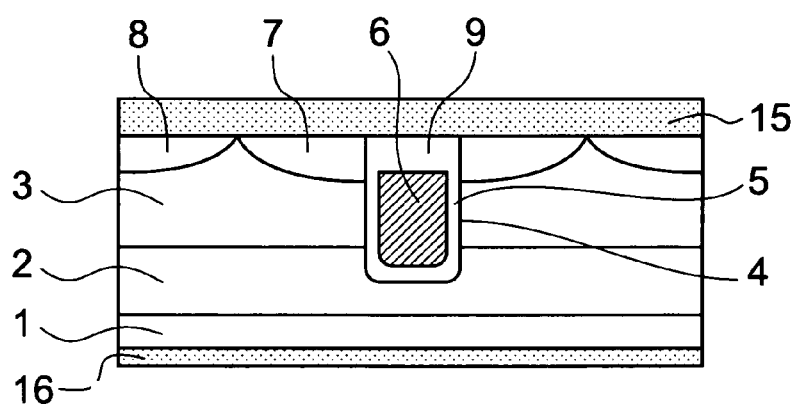
FIG. 11 is a schematic cross sectional view showing a process VIII in the method including manufacturing a vertical MOS transistor according to the present invention.

Finally, while the details are not illustrated, a passivation film is formed, the rear face is ground, and a rear face drain metal electrode 16 is formed to complete the vertical MOS transistor according to the present invention (refer to FIG. 11).

The vertical MOS transistor of the present invention which is manufactured through the above-mentioned manufacturing processes and which has the above-mentioned structure has the following features.

First of all, the heavily doped source area, the heavily doped body region, and the like can be formed in a self-align manner without giving consideration to the layout margin for deviation in alignment between the contact hole, and the heavily doped source region and the heavily doped body region, and the layout margin for deviation in alignment between the contact hole and the silicon trench. As a result, it is possible to realize the low cost promotion or miniaturization and the large current driving due to the area saving.

Secondarily, since the source metal electrode is prevented from being locally thinned as in the related art example, it is possible to form the flat metal film. This results in that a current is caused to uniformly flow, and hence the reliability of the wiring can be enhanced, and it is also possible to lighten an increase in the manufacturing cost, and reduction in the throughput due to the thickening of the metal layer. As a result, since the processability is enhanced, it is possible to stably manufacture the vertical MOS transistor.

Figure 12:
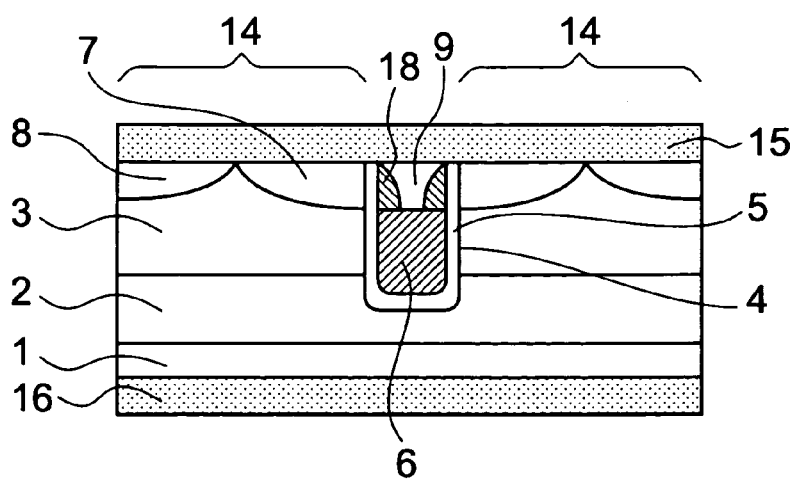
FIG. 12 is a schematic cross sectional view showing another embodiment of the vertical MOS transistor according to the present invention.

In addition, a structure shown in FIG. 12 may also be adopted as another embodiment. In FIG. 12, side spacers 18 formed of a nitride film or the like are formed on side walls of the trench 4 so as to overlie the heavily doped polycrystalline silicon 6. In general, in the vertical MOS transistor, insufficiency such as reduction in the withstand voltage of the oxide film and in the long term reliability is readily caused due to the reason that an electric field is readily concentrated on a portion of the oxide film between the heavily doped polycrystalline silicon and the heavily doped source region, and deterioration in film quality is readily caused in that portion of the oxide film due to the etching or the damage in terms of the process.

The insulating films formed of the nitride film or the like are formed as the side spacers 18 on the side walls of the trench 4 as shown in FIG. 12, which results in obtaining an effect that such insufficiency can be avoided. These side spacers 18 can be formed by depositing an insulating material 19 such as a nitride film to subject the resultant insulating material 19 to the anisotropic dry etching in FIG. 7 showing a part of the manufacturing processes of the present invention. Thereafter, the vertical MOS transistor having the structure shown in FIG. 12 can be completed in accordance with the process flow shown in FIGS. 8 to 11.

Figure 13:
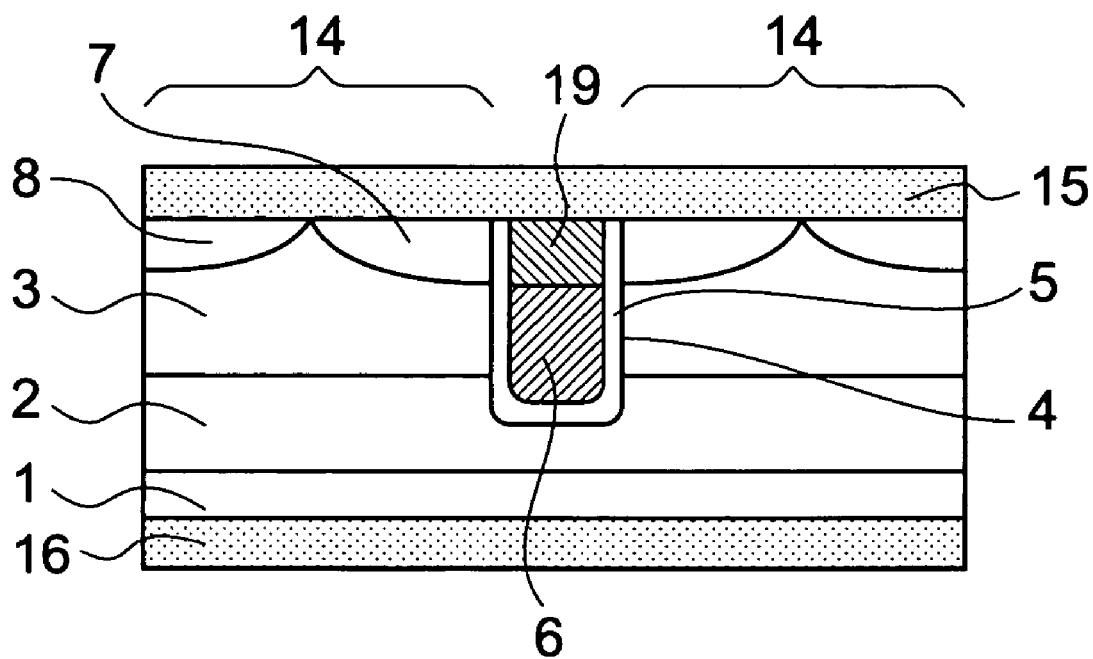
FIG. 13 is a schematic cross sectional view showing still another embodiment of the vertical MOS transistor according to the present invention.

Alternatively, to obtain the same effect as that in FIG. 12, a structure as shown in FIG. 13 may also be adopted as still another embodiment of the present invention. In this embodiment, it is utilized that when the above-mentioned insulating material is deposited in the process shown in FIG. 7, that insulating material is deposited in a thickness equal to or larger than a certain value in order to be perfectly filled in the trench 4 to allow the main surface of the semiconductor substrate to be flattened. Thereafter, the resultant insulating film is etched back to allow the (first) insulating film 19 to be left only within the trench 4. Here, the thickness of the insulating film enough for the insulating film to be perfectly filled in the trench is desirably equal to or larger than the width of the trench. More specifically, the thickness of the insulating film preferably falls within a range of 0.3 to 1.0 µm.

Thereafter, the vertical MOS transistor having the structure shown in FIG. 13 can be completed in accordance with the process flow shown in FIGS. 8 to 11.

As set forth hereinabove, according to the present invention, the miniaturization and high driving ability of the vertical MOS transistor can be attained. In addition, it is possible to provide to a highly reliable vertical MOS transistor, and it is also possible to realize a low manufacturing cost due to shortening of the processes, reduction in the material cost, and enhancement of the yield.

What is claimed is:

1. A method of manufacturing a vertical MOS transistor comprising:
    implanting an impurity of a second conductivity type into a main surface of a semiconductor substrate of a first conductivity type and thermally diffusing the impurity to form a body region of the second conductivity type;
    carrying out anisotropic etching on a region of the main surface of a semiconductor substrate to form a trench having a plurality of wall surfaces;
    forming a gate oxide film over the main surface of the semiconductor substrate and along the wall surfaces of the trench;
    depositing a polycrystalline silicon layer into the trench and over the main surface of the semiconductor substrate so as to overlie the gate oxide film;
    etching the polycrystalline silicon layer so as to remove the polycrystalline silicon layer overlying the main surface of the semiconductor substrate and so as to remove the polycrystalline silicon layer within the trench to a predetermined depth from the main surface of the semiconductor substrate to form a gate electrode within the trench;
    implanting an impurity of the first conductivity type into the main surface of the semiconductor substrate to form a source region of the first conductivity type;
    implanting an impurity of the second conductivity type into the main surface of the semiconductor substrate to form a body contact region of the second conductivity type;
    depositing a first insulating film over the main surface of the semiconductor substrate and the gate electrode;
    removing the first insulating film overlying the main surface of the semiconductor substrate by anisotropic etching to form side spacers made of the first insulating film on the wall surfaces of the trench so as to overly the gate electrode;
    depositing a second insulating film over the main surface of the semiconductor substrate, the gate electrode, and the first insulating film;
    etching back the second insulating film overlying the main surface of the semiconductor substrate so as to entirely expose the source region and the body contact region forming the main surface of the semiconductor substrate; and
    forming a source metal electrode over the main surface of the semiconductor substrate.

2. A method according to claim 1; wherein the first insulating film comprises a silicon nitride film.

3. A method according to claim 2; wherein the thickness of the silicon nitride film falls within a range of 0.3 to 1.0 µm.

4. A method according to claim 1; wherein the thickness of the first insulating film falls within a range of 0.3 to 1.0 µm.

5. A method of manufacturing a vertical MOS transistor comprising:
    implanting an impurity of a second conductivity type into a main surface of a semiconductor substrate of a first conductivity type and thermally diffusing the impurity to form a body region of the second conductivity type;
    carrying out anisotropic etching on a region of the main surface of a semiconductor substrate to form a trench having a plurality of wall surfaces;
    forming a gate oxide film over the main surface of the semiconductor substrate and along the wall surfaces of the trench;
    depositing a polycrystalline silicon layer into the trench and over the main surface of the semiconductor substrate so as to overlie the gate oxide film;
    etching the polycrystalline silicon layer so as to remove the polycrystalline silicon layer overlying the main surface of the semiconductor substrate and so as to remove the polycrystalline silicon layer within the trench to a predetermined depth from the main surface of the semiconductor substrate to form a gate electrode within the trench;
    implanting an impurity of the first conductivity type into the main surface of the semiconductor substrate to form a source region of the first conductivity type;
    implanting an impurity of the second conductivity type into the main surface of the semiconductor substrate to form a body contact region of the second conductivity type;
    depositing a first insulating film into the trench directly over the gate electrode;
    etching the first insulating film to form side spacers made of the first insulating film on the wall surfaces of the trench so as to overly the gate electrode;
    depositing a second insulating film over the main surface of the semiconductor substrate, the gate electrode, and the side spacers made of the first insulating film;
    etching back the second insulating film so as to entirely expose the source region and the body contact region forming the main surface of the semiconductor substrate; and
    forming a source metal electrode over the main surface of the semiconductor substrate.

6. A method according to claim 5; wherein the first insulating film comprises a silicon nitride film.

7. A method according to claim 6; wherein the thickness of the silicon nitride film falls within a range of 0.3 to 1.0 µm.

8. A method according to claim 5; wherein the thickness of the first insulating film falls within a range of 0.3 to 1.0 µm.

* * * * *